United States Patent
Moto et al.

[11] Patent Number: 6,167,194
[45] Date of Patent: *Dec. 26, 2000

[54] GUARD RING OF A HEATING DEVICE OF THE LIGHT IRRADIATION TYPE

[75] Inventors: Atsushi Moto, Yokohama; Shinji Suzuki, Kawaski, both of Japan

[73] Assignee: Ushiodenki Kabushiki Kaisha, Tokyo, Japan

[*] Notice: This patent is subject to a terminal disclaimer.

[21] Appl. No.: 09/370,217

[22] Filed: Aug. 9, 1999

[30] Foreign Application Priority Data

Aug. 7, 1998 [JP] Japan ................................. 10-234864

[51] Int. Cl.[7] ....................................................... F26B 3/30
[52] U.S. Cl. ........................... 392/418; 118/500; 118/728; 219/390
[58] Field of Search ..................... 219/390, 392, 219/405, 411; 392/416, 418; 118/724, 725, 728, 50.1, 500; 414/931–941

[56] References Cited

U.S. PATENT DOCUMENTS

| | | | |
|---|---|---|---|
| 5,527,393 | 6/1996 | Sato et al. | 118/725 |
| 5,534,072 | 7/1996 | Mizuno et al. | 118/728 |

FOREIGN PATENT DOCUMENTS 9-22879  1/1997  Japan .

Primary Examiner—Teresa Walberg
Assistant Examiner—Shawntina Fuqua
Attorney, Agent, or Firm—Nixon Peabody LLP; David S. Safran

[57] ABSTRACT

A guard ring of a heating device of the light irradiation type in which temperature can be easily controlled, matching to the temperature change of the substrate is good, the temperature change of the substrate can be made uniform, and in which processing is also simple. The object is achieved by the having:

a circular area which is opposite the substrate circumferential surface and which has essentially the same height as the substrate thickness;

an annular main part which is connected to the outside of the circular area which is opposite the circumferential surface of the substrate, and which has essentially the same thickness as the substrate, and with a heat capacity per unit of area which is essentially equal to the heat capacity of the substrate; and an annular substrate bearing part with a surface which runs from the lower end of the area which is opposite the circumferential surface of the substrate in the direction to the middle, has a tapered shape.

7 Claims, 3 Drawing Sheets

GUARD RING OF A HEATING DEVICE OF THE LIGHT IRRADIATION TYPE

BACKGROUND OF THE INVENTION

1. Field of the Invention

The invention relates to a guard ring which in rapid heat treatment of a round blank-like substrate, such as a semiconductor wafer or the like, using a heating device of the light irradiation type, fixes the substrates in a horizonal position and heats the outside circumferential surface in addition by radiation.

2. Description of Related Art

A round blank-like substrate, such as a semiconductor wafer, is subjected to heat treatment for layer formation, diffusion, baking and the like which comprises rapid heating, holding at a high temperature, and rapid cooling. Using a heating device of the light irradiation type a temperature increase to greater than or equal to 1000° C. can be achieved in a few seconds and rapid cooling produced by stopping the light irradiation.

The temperature in the peripheral area of the semiconductor wafer, as a result of heat irradiation from the outer circumferential surface of the semiconductor wafer or for similar reason, is lower than in its middle area, even if the semiconductor wafer surface is uniformly irradiated with light. In the case, for example, in which the temperature of the middle area of the semiconductor wafer is 1100° C., the temperature in the peripheral area is about 30° C. lower than in the middle area. If, in this way, the middle area and the peripheral area of the semiconductor wafer have a temperature difference, and thus, the temperature distribution becomes nonuniform, there are cases in which a dislocation error occurs which is called "slip," and in which scrap is produced.

To prevent formation of slip in the semiconductor wafer, a guard ring is used to prevent formation of the temperature difference between the middle area and the peripheral area of the semiconductor wafer during its heat treatment by rapid heating, holding at a high temperature, and rapid cooling. This guard ring is an annular body which is formed of a thin plate and of metal with a high melting point, such as molybdenum, tungsten or tantalum, or of a ceramic such as silicon carbide or the like. In the inner peripheral area of its circular opening, a semiconductor wafer bearing part is formed. The guard ring surrounds the semiconductor wafer.

This means that the guard ring is arranged such that the semiconductor wafer is installed in the circular opening of the annular guard ring. The bearing part holds the semiconductor wafer. Due to the light irradiation, the guard ring itself reaches a high temperature and also heats the opposite outer peripheral edge area of the semiconductor wafer by radiation, compensating for the heat radiation from the outer circumferential surface of the semiconductor wafer. In this way, the temperature difference between the middle area and the peripheral area of the semiconductor wafer is reduced, the temperature distribution is made essentially uniform, and the formation of slip is prevented.

One such guard ring is disclosed, for example, in the Japanese patent disclosure document HEI 9-22879.

As was described above, in the circular opening of an annular guard ring a semiconductor wafer is installed and the guard ring itself, due to light irradiation, reaches a high temperature. In this way, the heat radiation from the outer circumferential surface of the semiconductor wafer is balanced. To achieve suitable compensation (neither too much nor too little) and to eliminate the temperature difference between the middle area and the peripheral area of the semiconductor wafer, a state is desired in which the guard ring is a nearby semiconductor wafer and can act more or less as the outer edge area of the semiconductor wafer. This means that it is preferred that the height of the inner circumferential surface of the circular opening of the guard ring is equal to the height of the outer circumferential surface of the opposite semiconductor wafer, the thickness of the inner circumferential surface of the circular opening of the guard ring is likewise equal to the thickness of the outer circumferential surface of the opposite semiconductor wafer and also the heat capacity per unit of area is as great as the heat capacity of the wafer per unit of area. When one such guard ring is used, during light irradiation a temperature change of the guard ring exactly following the temperature change of the semiconductor wafer can be achieved. Therefore, the heat radiation from the outer circumferential surface of the semiconductor wafer can be exactly compensated and a uniform temperature distribution obtained.

If the heat capacity of the guard ring per unit of area is large, the temperature increase of the guard ring is delayed, by which the amount of compensation with regard to heat radiation from the outer circumferential surface of the semiconductor wafer becomes less as the temperature increases. Here, the temperature distribution of the semiconductor wafer cannot be made uniform. Furthermore, when the temperature drops after stopping the light irradiation, the temperature drop of the guard ring is slowed down. In this case, compensation with regard to the heat radiation from the outer circumferential surface of the semiconductor wafer is unduly high so that the temperature distribution of the semiconductor wafer cannot be made uniform. When the heat capacity of the guard ring per unit of area is small, the exactly opposite phenomena occurs, and likewise the temperature distribution of the semiconductor wafer cannot be made uniform.

Since the semiconductor wafer is installed in the circular opening of the guard ring, with consideration of workability during installation, variance of the dimension of the outside diameter of the semiconductor wafer, and the difference of the thermal expansion between the guard ring and the semiconductor wafer, clearance of about 1 mm between the inner circumferential surface of the circular opening of the guard ring and the outer circumferential surface of the semiconductor wafer is required.

In the case of determining the temperature of the semiconductor wafer with a radiation thermometer of the noncontact type from the bottom (rear surface) of the semiconductor wafer, therefore, an error occurs in temperature measurement when from this clearance light enters, making it difficult to control the temperature of the semiconductor wafer. As a result, light must be prevented from entering through the clearance between the inner circumferential surface of the circular opening of the guard ring and the outer circumferential surface of the semiconductor wafer.

When supporting the semiconductor wafer by means of the guard ring it is necessary to make the contact surface as small as possible and to reduce the heat conduction between the two. If the temperature change of the guard ring exactly follows the temperature change of the semiconductor wafer, only little heat conduction occurs even if the contact surface is large. However, exact matching is difficult in practice. If the contact surface is large, heat transport due to heat conduction occurs between the guard ring and the semiconductor wafer. If heat conduction occurs, the temperature of the semiconductor wafer is influenced by the temperature of the guard ring, making computation for prediction of the temperature distribution of the semiconductor wafer very complicated and thus also complicating control to make the temperature of the semiconductor wafer uniform. If heat conduction can be prevented, it is enough only to consider heat radiation, simplifying the prediction and control of the temperature distribution.

For the material of the guard ring, there is a need for properties such as excellent heat resistance, excellent acid resistance and good thermal conductivity and the like. A material which has exactly these properties is ceramic, such as silicon carbide (SiC) or the like. But, it is difficult to process these ceramics with high precision. If they have complicated or thin shapes, they are difficult to produce. Therefore, t is necessary for them to have shapes which facilitate processing.

FIGS. 7 to 9 each show a conventional example of a guard ring. Here, the guard ring disclosed in the Japanese patent disclosure document HEI 9-22879 and described above is shown in cross section.

In FIG. 7, a guard ring 26 (an auxiliary plate similar to the substrate) has three small projections 30 (only one of which is shown) in the form of thinned plates projecting in a direction toward the middle from the inner circumferential surface of a main part 28 of a thin plate with the same thickness as that of a semiconductor wafer W. The bottom of the main part 28 of the thin plate and the bottoms of the projections 30 are in the same plane. The semiconductor wafer W is supported by the projections 30. Since the bottom of the main part 28 and the bottoms of the projections 30 are in the same plane, the height of the inner circumferential surface of the main part 28 which is opposite the outer circumferential surface of the semiconductor wafer W is lower. Therefore, the heat radiated from the outer circumferential surface of the semiconductor wafer W is not adequately compensated. Furthermore, it can be considered a disadvantage that heat conduction occurs between the semiconductor wafer W and the guard ring 26 because the semiconductor wafer W is in surface contact with the projections 30.

In FIG. 8, a guard ring 36 is shown, and in it, there are three small projections 40 in the form of thinned plates projecting toward the middle from the inner circumferential surface of a main part 38 of a thin plate with the same thickness as that of a semiconductor wafer W as in the guard ring 26 in FIG. 7. The projections 40 project from the bottom of the main part 38. The bottom of the main part 38 and the tops of the projections 40 are in the same plane. Therefore, the outer circumferential surface of the semiconductor wafer W is as high as the inner circumferential surface of the opposite main part 38, by which the heat radiated from the outer circumferential surface of the semiconductor wafer W can be adequately compensated. However, since the semiconductor wafer W is in surface contact with the projections 40, heat conduction occurs between the semiconductor wafer W and the guard ring 36. To reduce the amount of heat moving by this heat conduction, the thickness of the projections 40 must be reduced to reduce the heat capacity. But, it is difficult to make projections 40 in the form of very thin plates.

In FIG. 9, a guard ring 46 is shown and in it there are three small projections 50 in the form of thinned plates projecting toward the middle from the inner circumferential surface of a main part 48 of a thin plate with the same thickness as that of a semiconductor wafer W. The tops of the projections 50 are provided with microscopically small convex sites 52 which support the semiconductor wafer W by point contact. Thus, the amount of heat moving by heat conduction is reduced. But, in this case as well, the height of the inner circumferential surface of the main part 48 which is opposite the outer circumferential surface of the semiconductor wafer W is lower because the bottom of the main part 48 and the bottoms of the projections 50 are in the same plane. Therefore, the heat radiated from the outer circumferential surface of the semiconductor wafer W is not adequately compensated. Furthermore, it is very difficult to form convex sites 52 on the tops of the projections 50.

The guard rings as shown in FIGS. 7 to 9 have the aforementioned defects. In each of these guard rings, light from the clearance between the outer circumferential surface of the semiconductor wafer W and the inner peripheral surface of the main part of the thin plate enters by diffraction towards the bottom because, for example, three projections in the form of thinned plates support the semiconductor wafer W. In the case of determining the temperature of the semiconductor wafer using a radiation thermometer of the noncontact type from the bottom of the semiconductor wafer, therefore, an error occurs in temperature measurement due to this light which enters from this clearance by diffraction. This results in the disadvantage that it is difficult to control the temperature of the semiconductor wafer.

These guard rings are formed from a ceramic material such as silicon carbide or the like. However, it is very difficult processing to form small projections in one piece and projecting upwards in the form of thinned plates on the inner circumferential surface of the main part of the thin plate which has been formed from ceramic, i.e. which is "pottery."

SUMMARY OF THE INVENTION

Therefore, a primary object of the invention is to devise a guard ring of a heating device of the light irradiation type in which matching to the temperature change of the substrate, for example, a semiconductor wafer, is good, between the semiconductor wafer and the guard ring there is hardly any heat transport by heat conduction, the heat radiation from the outer circumferential surface of the semiconductor wafer is compensated as accurately as possible, the temperature distribution of the semiconductor wafer can be made uniform, light by diffraction is prevented from striking the bottom of the semiconductor wafer, simple temperature control is possible, and in which, moreover, manufacture is simple.

In a guard ring, which peripherally fixes a round substrate which is heat treated by light irradiation, and which furthermore, itself, reaches a high temperature by light irradiation and additionally heats the outer circumferential surface of the substrates by radiation, the object is achieved in accordance with the invention by the following features:

a circular area which is opposite the substrate circumferential surface and which has the same height as the substrate thickness;

an annular main part which is connected to the outside of the above described area which is opposite the circumferential surface of the substrate, and which has essentially the same thickness as the substrate, and with a heat capacity per unit of area which is essentially equal to the heat capacity of the substrate; and an annular substrate bearing part with a surface which runs from the lower end of the area which is opposite the circumferential surface of the substrate in the direction to the middle, has a tapered shape, and on which the substrate is seated.

In the following, the invention is explained in detail using several embodiments shown in the drawings:

DETAILED DESCRIPTION OF THE INVENTION

Figure 1:
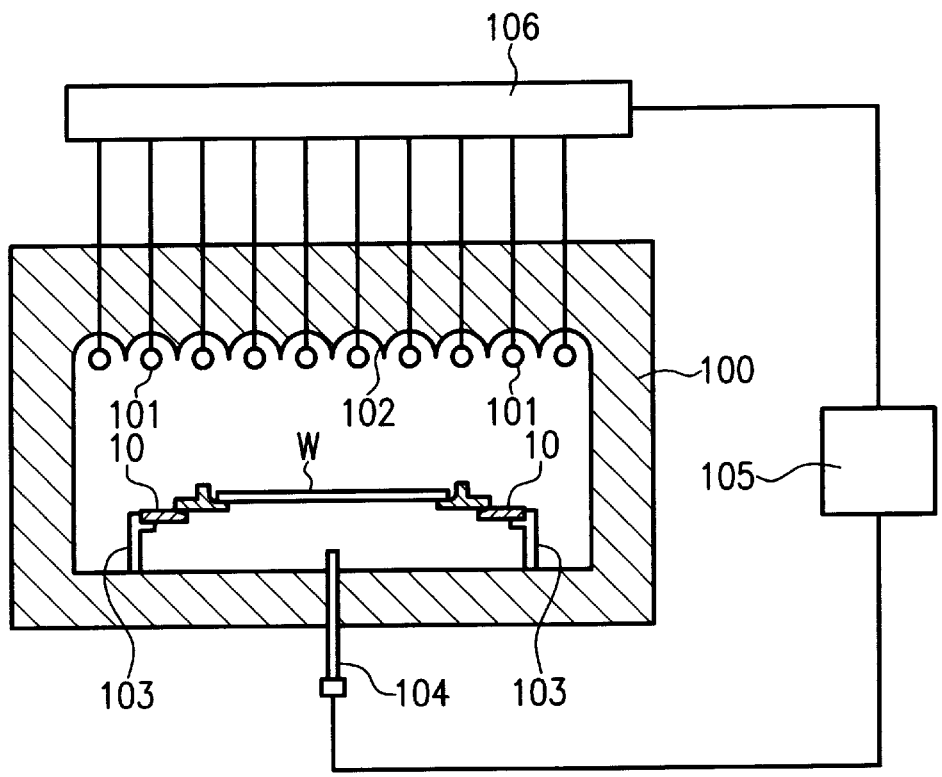
FIG. 1 is a schematic cross section of the arrangement of a heating device of the light irradiation type.

FIG. 1 schematically shows the arrangement of one example of a heating device of the light irradiation type. The top side of the interior of an oven 100 is provided with a circular light source in which there are several annular halogen lamps 101 arranged concentrically. The backs of the halogen lamps 101 are provided with trough-like mirrors 102 with a convex cross-sectional shape. The light emitted from the lamps 101 is emitted downward with high efficiency. The bottom of the interior of the oven 100 is provided with a support frame 103 which supports a guard ring 10. The guard ring 10 fixes a round blank-like semiconductor wafer W with an outside diameter of, for example, 300 mm and a thickness of 0.8 mm, in a horizontal position. Therefore, the light emitted by the lamps 101 irradiates the semiconductor wafer W and the guard ring 10. The support frame 103 is turned by means of a turntable (not shown) so that the semiconductor wafer W is uniformly heated.

Furthermore, if necessary, between the lamps 101 and the semiconductor wafer W there can be a fused silica glass window to make the atmosphere in the vicinity of the semiconductor wafer W and the atmosphere in the vicinities of the lamps 101 different. FIG. 1 shows neither an inlet opening nor an outlet opening which is used for transporting the semiconductor wafer W into the oven 100 and for removing the semiconductor wafer W from the oven 100.

Underneath the semiconductor wafer W, there is a radiation thermometer 104 of the noncontact type by which the temperature of the semiconductor wafer W is determined. Furthermore, a temperature control element 105 controls the output of a lamp power source 106 as a result of the ascertained temperature of the radiation thermometer, such that the semiconductor wafer W is heat treated at a stipulated rate of temperature increase, a stipulated holding temperature, a stipulated holding time, and a stipulated rate of temperature decrease.

Figure 2:
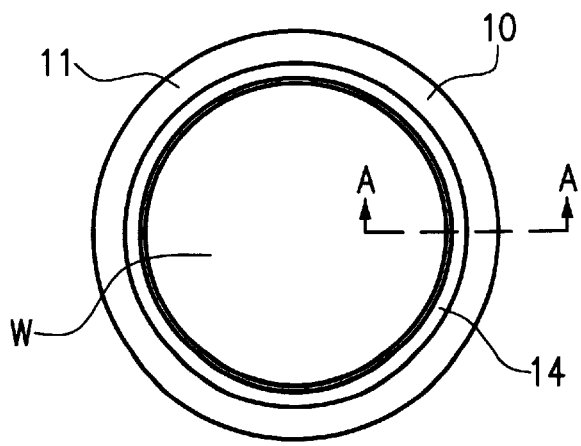
FIG. 2 is a plan view of the positional relationship between the guard ring and a semiconductor wafer.

The guard ring 10 is an annular body, for example, with an outside diameter of 360 mm and an inside diameter of 296 mm, as is shown in FIG. 2. The semiconductor wafer W is fixed such that it is located in a circular opening which has been, e.g., drilled out of the guard ring 10. The guard ring 10 is formed from silicon carbide. Its thermal properties, such as the coefficient of thermal expansion, the specific heat and the like are very similar to the thermal properties of the silicon semiconductor wafer W.

Figure 3:
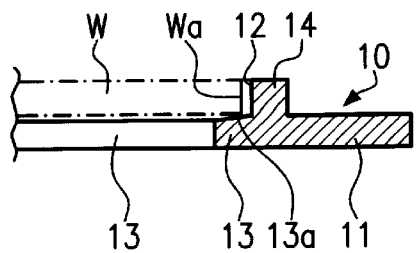
FIG. 3 is a schematic cross section of one embodiment of the invention taken along line A—A in FIG. 2.

FIG. 3 is a longitudinal section which corresponds to line A—A as shown in FIG. 2 in the direction of the arrow. Here the guard ring 10 has an annular main part 11 with an end supported by the support frame 103. The thickness of the main part 11 is 0.8 mm and is equal to the thickness of the semiconductor wafer W. The heat capacity of the main part 11 per unit of area is therefore essentially equal to the heat capacity of the semiconductor wafer W per unit of area. It can therefore function as a nearby semiconductor wafer.

On the inside of the main part 11, an annular projection 14 is formed with an inner circumferential surface which is opposite the outer circumferential surface Wa of the semiconductor wafer W with a spacing of roughly 1 mm when the semiconductor wafer W is fixed. It thus forms an area 12 which is essentially parallel to the outer circumferential surface Wa of the semiconductor wafer W and which is opposite the circumferential surface of the substrate. The height of the area 12 is 0.8 mm and is therefore identical to the thickness of the semiconductor wafer W. The outer circumferential surface Wa of the semiconductor wafer W and the area 12 are therefore essentially exactly opposite one another in the vertical direction when the semiconductor wafer W is fixed.

From the lower end of the area 12, a substrate bearing part 13 on which the semiconductor wafer W is seated is formed which extends radially inwardly. The surface 13a of the substrate bearing part 13 has a shape which tapers in the direction to the middle. Its angle of incline is, for example, roughly 5°. When the semiconductor wafer W is seated on the substrate bearing part 13, the semiconductor wafer W is therefore supported in linear contact with the surface 13a of the substrate bearing part 13. This means that the contact surface is extremely small and heat transport as a result of heat conduction between the semiconductor wafer W and the guard ring 10 is small. Heat conduction therefore has no effect on heat transport, even if the thickness of the substrate bearing part 13 is increased. This means that the thickness of the substrate bearing part 13 can be increased because even when its thickness is increased the defect of heat transport as a result of heat conduction does not arise. Therefore, the substrate bearing part 13 can be easily processed.

Figure 4:
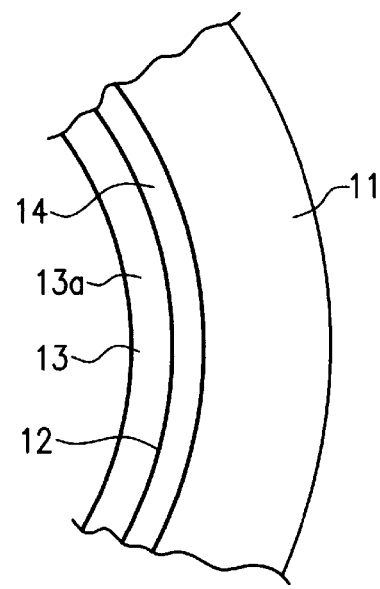
FIG. 4 is an partial plan view of a guard ring.

The substrate bearing part 13 has a width of roughly 2 mm and is made annular, as is shown in FIG. 4. It is not formed of several small, thin, plate-shaped projections as in the conventional examples shown in FIGS. 7 to 9. If the semiconductor wafer W is seated on the substrate bearing part 13, the clearance between the outer circumferential surface Wa of the semiconductor wafer W and the area 12 is shielded by the substrate bearing part 13. Therefore, the light emitted from above this clearance is prevented from reaching below the semiconductor wafer W by diffraction.

Figure 5:
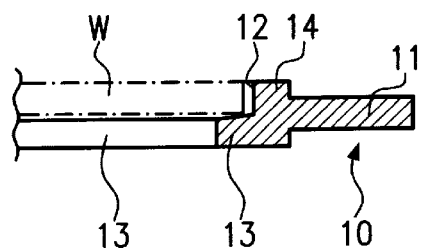
FIG. 5 is a schematic cross section corresponding to that of FIG. 2, but of another embodiment.
Figure 6:
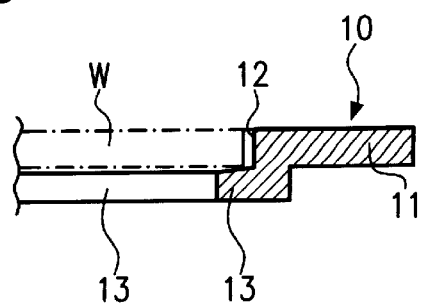
FIG. 6 is a schematic cross section corresponding to that of FIG. 2, but of a further embodiment.

In the guard ring 10 shown in FIG. 3 the bottom of the main part 11 and the bottom of the substrate bearing part 13 are located in the same plane to simplify production. The main part 11 can, however, also extend outwardly from the middle area of the projection 14, as is shown in FIG. 5. Furthermore, the arrangement shown in FIG. 6 is possible in which there is no projection and the inner peripheral surface of the main part 11 forms the area 12.

If the semiconductor wafer W is seated and supported on the substrate bearing part 13 of the guard ring 10, and when the lamps 101 of the heating device of the light irradiation type are operated, the temperatures of the semiconductor wafer W and the guard ring 10 increase quickly, heat also being emitted from the outside circumferential surface Wa of the semiconductor wafer W. In doing so, the main part 11 of the guard ring 10 has the same thickness as that of the semiconductor wafer W. Also the heat capacity per unit of area is roughly identical to the heat capacity of the semiconductor wafer W per unit of area. The guard ring 10 can therefore act as a nearby semiconductor wafer W. The temperature of the guard ring 10 therefore exactly follows the temperature change of the semiconductor wafer W. Furthermore, the outer circumferential surface Wa of the semiconductor wafer W and the area 12 of the guard ring 10 are essentially exactly opposite one another in the vertical direction. The heat emitted from the outer circumferential surface Wa of the semiconductor wafer W is therefore exactly compensated by the heat emitted from the area 12 of the guard ring 10. The temperature distribution of the semiconductor wafer W therefore becomes uniform. Thus, formation of slip can be prevented.

Furthermore, the semiconductor wafer W is supported in a linear contact state on the surface 13a of the substrate bearing part 13, the contact surface being extremely small. The heat transport as a result of heat conduction between the semiconductor wafer W and the guard. ring 10 is therefore low. As a result, only radiational heat transport needs to be considered. Prediction of the temperature distribution and control of making the temperature of the semiconductor wafer W uniform are therefore simple. Furthermore, the light emitted from above through the clearance between the outer circumferential surface Wa of the semiconductor wafer W and the area 12 is prevented from reaching the area below the semiconductor wafer W. When the temperature is measured by a radiation thermometer of the noncontact type which is located below the semiconductor wafer W, therefore no errors occur. Thus, the temperature can be exactly measured.

Figure 7:
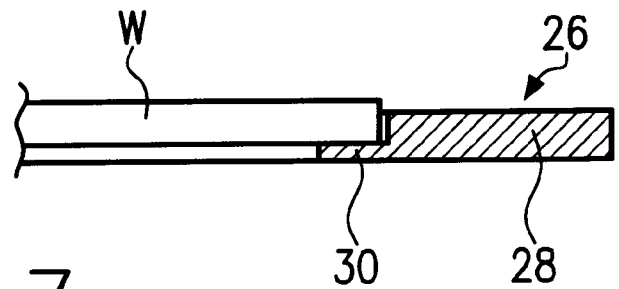
FIG. 7 is a schematic of one conventional example.
Figure 8:
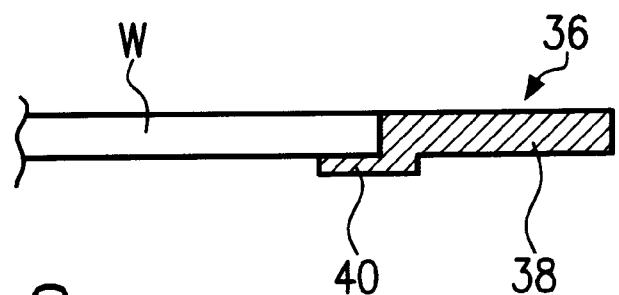
FIG. 8 is a schematic of another conventional example.
Figure 9:
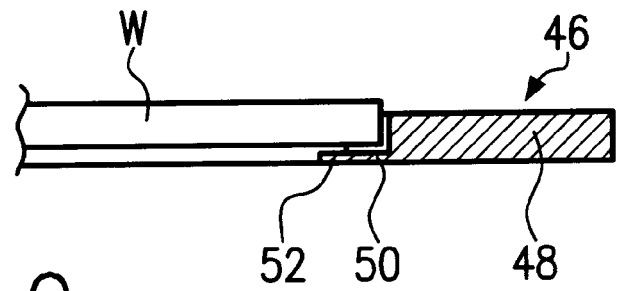
FIG. 9 shows a schematic of a further conventional example.

As noted in the "Background" part of this specification, when the guard ring 10 is formed from a ceramic material, such as silicon carbide or the like, production of the small projections shown in the conventional examples of FIGS. 7 to 9 in the form of thin plates is very difficult. The substrate bearing part 13 of the guard ring 10 in accordance with the invention is, however, made completely annular. Its thickness can also be increased. Therefore, the advantage of simple production arises.

Action of the invention

As was described above, in accordance with the invention, a guard ring of a heating device of the light irradiation type is obtained with the following advantages:

good matching to the temperature change of the substrate, for example, of a semiconductor wafer;

exact compensation of the heat radiation from the outer circumferential surface of the semiconductor wafer;

making the temperature distribution of the semiconductor wafer uniform;

hardly any heat transport between the semiconductor wafer and the guard ring as a result of heat conduction;

light is prevented from reaching the bottom (rear surface) of the semiconductor wafer;

simple temperature control; and simple manufacture.

What we claim is:

1. Guard ring arrangement of a heating device of the light irradiation type, which peripherally fixes a substrate which is heat treated by light irradiation, the guard ring itself reaching a high temperature by light irradiation, comprising an annular substrate bearing part with an inclined surface upon which the substrate is seated;

a circular area which has the same height as a thickness of the substrate and extends around a circumferential surface of the substrate, said circular area extending upwardly from the substrate bearing part; and an annular main part which has essentially the same thickness as the substrate, and with a heat capacity per unit of area which is essentially equal to the heat capacity of the substrate, said main part extending radially outwardly from the circular area.

2. Guard ring arrangement as claimed in claim 1, wherein a stepped configuration is formed with substrate bearing part forming a lower step and the annular main part forms an upper step; and wherein a radially inwardly facing surface of the main part forms the circular area which has essentially the same height as the substrate.

3. Guard ring arrangement as claimed in claim 1, wherein an L-shaped configuration is formed with the substrate bearing part forming a base leg of the L-shaped configuration and the circular area being formed on an inner peripheral surface of an upright leg of the L-shape; and wherein the main part projects for middle area of an outer peripheral surface of the upright leg.

4. Guard ring arrangement as claimed in claim 1, wherein the substrate bearing part and the annular main part are located essentially in one plane and the circular area is an inner peripheral surface of a projection which projects upwardly between the substrate bearing part and the main part.

5. Guard ring arrangement as claimed in claim 1, wherein the inclined surface of the substrate bearing part has an angle of inclination of about 5°.

6. Guard ring arrangement as claimed in claim 1, wherein the guard ring is made of a ceramic material.

7. Guard ring arrangement as claimed in claim 6, wherein the ceramic material is silicon carbide.

\* \* \* \* \*